(12) United States Patent
Guo

(10) Patent No.: US 10,991,911 B2
(45) Date of Patent: Apr. 27, 2021

(54) PACKAGE STRUCTURE, PACKAGING METHOD AND ELECTRONIC DEVICE

(71) Applicant: Wuhan China Star Optoelectronics Semiconductor Display Technology Co., Ltd., Wuhan (CN)

(72) Inventor: Tianfu Guo, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/739,087

(22) Filed: Jan. 9, 2020

(65) Prior Publication Data

US 2020/0152912 A1    May 14, 2020

Related U.S. Application Data

(60) Division of application No. 15/958,224, filed on Apr. 20, 2018, now Pat. No. 10,581,016, which is a continuation of application No. PCT/CN2018/073840, filed on Jan. 23, 2018.

(30) Foreign Application Priority Data

Nov. 10, 2017    (CN) .......................... 201711103046.6

(51) Int. Cl.
*H01L 51/52*    (2006.01)
*H01L 51/00*    (2006.01)
*C08J 3/28*    (2006.01)
*B32B 27/00*    (2006.01)

(52) U.S. Cl.
CPC .......... *H01L 51/5253* (2013.01); *B32B 27/00* (2013.01); *C08J 3/28* (2013.01); *H01L 51/0005* (2013.01); *C08J 2363/10* (2013.01)

(58) Field of Classification Search
CPC ................................................... H01L 51/5253
See application file for complete search history.

(56) References Cited

FOREIGN PATENT DOCUMENTS

| CN | 101431145 A | 5/2009 |
|---|---|---|
| CN | 103265925 A | 8/2013 |
| CN | 106188497 A | 12/2016 |
| CN | 106784372 A | 5/2017 |
| CN | 107170902 A | 9/2017 |
| EP | 0263237 A2 | 4/1988 |

*Primary Examiner* — Austin Murata
(74) *Attorney, Agent, or Firm* — Hemisphere Law, PLLC; Zhigang Ma

(57) ABSTRACT

The beneficial effects of the present application are as follows: the modified epoxy resin is doped with the modified epoxy resin in the buffer layer, the modified epoxy resin is reacted with the first barrier layer under UV irradiation, so that the modified epoxy resin is adhered to the first barrier layer to adhere the buffer layer and the first barrier layer and solve the technical problem that the organic layer and the inorganic layer are easily peeled off in the prior art. The present application also provides a packaging method and an electronic device.

6 Claims, 3 Drawing Sheets

PACKAGE STRUCTURE, PACKAGING METHOD AND ELECTRONIC DEVICE

RELATED APPLICATIONS

This application is a continuation application of PCT Patent Application No. PCT/CN2018/073840, filed Jan. 23, 2018, which claims the priority benefit of Chinese Patent Application No. CN 201711103046.6, filed Nov. 10, 2017, and division application of U.S. Ser. No. 15/958,224, filed Apr. 20, 2018, which is herein incorporated by reference in its entirety.

FIELD OF THE DISCLOSURE

The present disclosure relates to an OLED technology field, and more particularly to a package structure, a packaging method and an electronic device.

BACKGROUND OF THE DISCLOSURE

OLED is very sensitive to water and oxygen, in order to achieve a good water blocking oxygen effect, the commonly used thin film encapsulation of its water blocking oxygen performance requirements. Inorganic thin film layer of water resistance oxygen capacity is generally much better than the organic thin film layer, but in the application of flexible products, the inorganic thin film layer of stress in the flexible bending process and its prone to fracture phenomenon. Therefore, the organic thin film layer is often used as a buffer layer in order to achieve the purpose of releasing the stress of the inorganic film layer and enhancing the flexibility of the thin film encapsulation material. However, the performance of the organic/inorganic thin film layers is greatly different from each other, and the phenomenon that the film layers are peeled off each other often occurs.

SUMMARY OF THE DISCLOSURE

The purpose of the present application is to provide a package structure to solve the problem that the prior art has the problem that the film layers are peeled off each other.

For the purpose of the present application, the present application provides the following technical solutions.

In a first aspect, the present application provides a package structure, including a first barrier layer and a buffer layer arranged in stacked-layers. The buffer layer is doped with a modified epoxy resin, and the modified epoxy resin is reactive with the first barrier layer under UV irradiation configured to adhere the buffer layer to the first barrier layer.

In a first possible implementation manner of the first aspect, the buffer layer includes a first surface in contact with the first barrier layer and a second surface opposite to the first surface, the concentration of the modified epoxy resin gradually decreases in a direction of the first surface toward the second surface.

With reference to the first aspect and the first possible implementation manner of the first aspect, in a second possible implementation manner of the first aspect, the modified epoxy resin is a modified epoxy acrylate, the modified epoxy acrylate has a chemical formula of

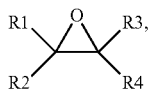

where at least one of the groups R1, R2, R3 or R4 has an alkoxy group.

With reference to the first aspect and the second possible implementation manner of the first aspect, in a third possible implementation manner of the first aspect, the surface of the first barrier layer further has a hydroxyl group, the chemical reaction equation of the hydroxyl group and the modified epoxy resin is:

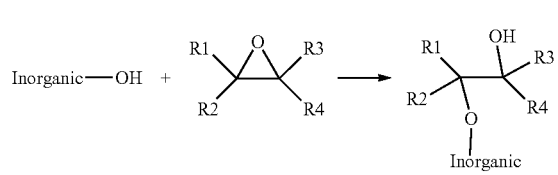

In a fourth possible implementation manner of the first aspect, the first barrier layer includes a third surface in contact with the buffer layer and a fourth surface opposite to the third surface, a groove is provided in a middle of the fourth surface; the package structure further includes a substrate, a base layer and an inorganic film layer arranged in stacked-layers, the inorganic film layer and the first barrier layer are stacked, the fourth surface is in contact with the inorganic film layer, the groove and the inorganic film layer enclose to form a vacuum closed space, where the vacuum closed space is configured to encapsulate the OLED layer.

With reference to the first aspect and the fourth possible implementation manner of the first aspect, in a fifth possible implementation manner of the first aspect, the package structure further includes a second barrier layer, and the second barrier layer is stacked on the buffer layer.

With reference to the first aspect and the fifth possible implementation manner of the first aspect, in a sixth possible implementation manner of the first aspect, the second barrier layer surrounds the first barrier layer and a lateral surface of the buffer layer so that the OLED layer is surrounded by the first barrier layer and the second barrier layer.

With reference to the first aspect and the fifth possible implementation manner of the first aspect, in a seventh possible implementation manner of the first aspect, the buffer layer surrounds the first barrier layer and the second barrier layer surrounds the buffer layer such that the OLED layer is surrounded by the first barrier layer, the buffer layer, and the second barrier layer.

In a second aspect, the present application provides a packaging method, including the following steps:
providing a substrate, sequentially forming a base layer, an inorganic film layer, an OLED layer and a first barrier layer on the substrate;
forming a buffer layer on the first barrier layer by using the inkjet printing process, wherein the buffer layer is doped with a modified epoxy acrylate;
irradiating the buffer layer and the first barrier layer with UV light so that the modified epoxy acrylate reacts with the first barrier layer to adhere the buffer layer to the first barrier layer.

In a first possible implementation manner of the second aspect, the buffer layer includes a first surface in contact with the first barrier layer and a second surface opposite to the first surface, in fabricating the buffer layer, the ink jet printing process is used for a plurality of times so that a basic layer is formed each time, the modified epoxy acrylate doped during ink jet printing is sequentially reduced so that the concentration of the modified epoxy acrylate in the buffer layer gradually decreases in a direction of the first surface toward the second surface.

In a third aspect, the present application provides an electronic device, including the package structure in various implementations of the first aspect.

Beneficial effects of the present application:
in the package structure provided by the present application, the modified epoxy resin is doped in the buffer layer, the modified epoxy resin reacts with the first barrier layer under UV irradiation such that the modified epoxy resin is adhered to the first barrier layer for adhering the buffer layer and the first barrier layer, which solves the technical problem that the organic layer and the inorganic layer are easily peeled off in the prior art.

BRIEF DESCRIPTION OF THE DRAWINGS

To describe the technical solutions in the embodiments of the present application or in the prior art more clearly, the following briefly introduces the accompanying drawings required for describing the embodiments or the prior art. Apparently, the accompanying drawings in the following description show merely some embodiments of the application, and a person of ordinary skill in the art may still derive other drawings from these accompanying drawings without creative efforts.

DETAILED DESCRIPTION OF PREFERRED EMBODIMENTS

The technical solutions in the embodiments of the present application are clearly and completely described below with reference to the accompanying drawings in the embodiments of the present application. Apparently, the described embodiments are merely some but not all of the embodiments of the present application. All other embodiments obtained by a person of ordinary skill in the art based on the embodiments of the present application without creative efforts shall fall in the protection scope of this application.

Figure 1:
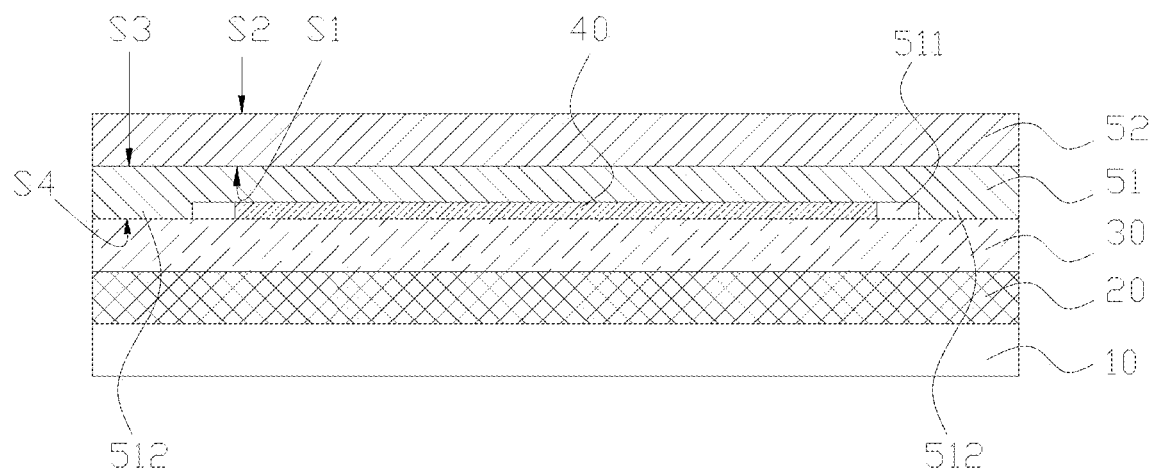
FIG. 1 is a schematic structural diagram of the package structure according to the embodiment of the present application.

Referring to FIG. 1, the embodiment of the present application provides a package structure, the package structure includes a first barrier layer 51 and a buffer layer 52 stacked in layers, wherein the buffer layer 52 is doped with a modified epoxy resin, the modified epoxy resin can react with the first barrier layer 51 under UV irradiation so as to make the modified epoxy resin adhere to the first barrier layer 51 for adhering the buffer layer 52 and the first barrier layer 51.

In this embodiment, the modified epoxy resin is a modified epoxy acrylate, and the modified epoxy acrylate is formed by introducing an alkoxy group into a common epoxy acrylate. Ordinary epoxy acrylates are obtained by the esterification of epoxy compounds with (meth) acrylic acid or with —OH. The commonly used epoxy compounds or epoxy resins are bisphenol A epoxy resin, hexahydrophthalic acid epoxy resin, aliphatic epoxy resin and the like. They are characterized by the p-position of the acrylic group has a —OH group, the molecule contains hydroxyl, ether, ester and other polar groups, so that resin molecules and adherend molecules have a strong interaction force, excellent adhesive properties. However, the traditional high viscosity epoxy acrylate (>500 cps). It has been tested that modified epoxy acrylates can be prepared by introducing alkoxy groups into the molecular structure of epoxy acrylate, which can be much lower in viscosity (<20 cps) without affecting their adhesive properties.

The ink doped with the modified epoxy acrylate is sprayed on the buffer layer 52 in the package structure by ink jet printing (IJP) by doping a certain amount of the modified epoxy acrylate with ink. After the inkjet printing process of UV curing, both to cure the ink, but also to cure the ink doped with modified epoxy acrylate, making the modified epoxy acrylate into excellent performance of UV curing glue, can play the role of adhering the inorganic layer and the organic layer. In this embodiment, the buffer layer 52 is an inorganic film layer, and the surface of the buffer layer 52 usually contains a hydroxyl group (—OH). The modified epoxy acrylate contains an epoxy group, and the following reaction can occur under ultraviolet light irradiation:

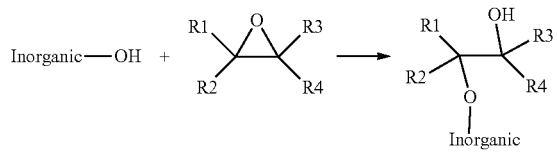

Where Inorganic-OH represents the first barrier layer, which has a hydroxyl group-OH; at least one of the groups R1, R2, R3 or R4 has an alkoxy group, and other groups may contain a hydroxyl group, an ether group, an ester group and other polar groups.

Through the above reaction, a strong interaction force is formed between the modified epoxy acrylate and the buffer layer 52, so that the problems that the inorganic and organic film layers in the encapsulation structure are easily peeled off can be effectively solved.

Of course, in other embodiments, the modified epoxy resin may also be other organic materials having epoxy groups as long as it has the function of adhering the organic layer and the inorganic layer.

In the present embodiment, due to the process of UV curing itself in the inkjet printing process, the process of doping the modified epoxy resin can directly use the UV curing process of the original inkjet printing without any additional process, thereby reducing the difficulty of process manufacture.

Figure 2:
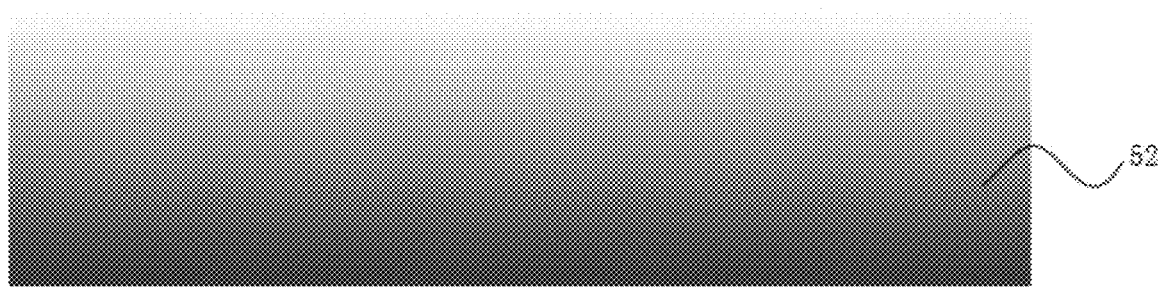
FIG. 2 is a schematic structural diagram of the buffer layer in FIG. 1 macro structure.
Figure 3:
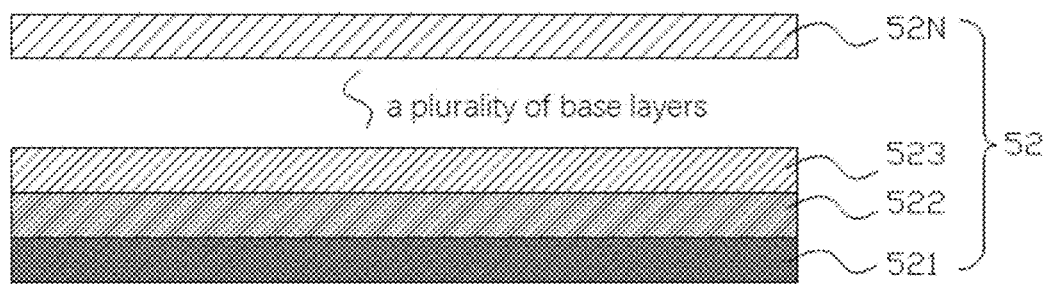
FIG. 3 is a schematic structural diagram of the buffer layer in FIG. 2 microstructure.

In an implementation manner, referring to FIG. 1 to FIG. 3, the buffer layer 52 includes a first surface S1 contacting with the first barrier layer 51 and a second surface S2 facing away from the first surface S1. The modified epoxy resin is layered in the buffer layer 52, and the concentration of the modified epoxy resin gradually decreases toward the second surface S2 along the first surface S1.

In this embodiment, please refer to FIG. 3, which is an enlarged microscopic view of the buffer layer 52. The layered buffer layer 52 includes a first base layer 521, a second base layer 522, a third base layer 523, an $N^{th}$ base layer 52N. The concentration of each base layer doped modified epoxy acrylate is gradually decreased to form a macrostructure of the buffer layer 52 as shown in FIG. 2 to enhance the adhesion effect of the buffer layer 52 and the first barrier layer 51, at the same time, it will not affect the ink's flattening effect.

In an implementation manner, referring to FIG. 1, the first barrier layer 51 includes a third surface S3 in contact with the buffer layer 52 and a fourth surface S4 opposite to the third surface S3. A groove 511 is provided in the middle of the fourth surface S4. The package structure further includes a substrate 10, a basic layer 20 and an inorganic film layer 30 stacked on top of each other, the inorganic film layer 30 and the first barrier layer 51 are stacked, the fourth surface S4 is in contact with the inorganic film layer 30, the groove 511 and the inorganic film layer 30 are enclosed to form a vacuum closed space, where the vacuum closed space is used to encapsulate the OLED layer.

In the present embodiment, the substrate 10 is preferably a glass substrate, the basic layer 20 is preferably a PI material, and the inorganic film layer 30 is a TFT layer. The fourth surface S4 of the first barrier layer 51 has a closed end 512 that is adhered to the inorganic film layer 30. The closed end 512 is located on both sides of the first barrier layer 51. The groove 511 is connected between the two closed ends 512 such that the space of the groove 511 enclosed by the two closed ends 512, the inorganic layer 30 and the first barrier layer 512 is an enclosed space and is vacuum-treated for accommodating the OLED layer 40.

Figure 4:
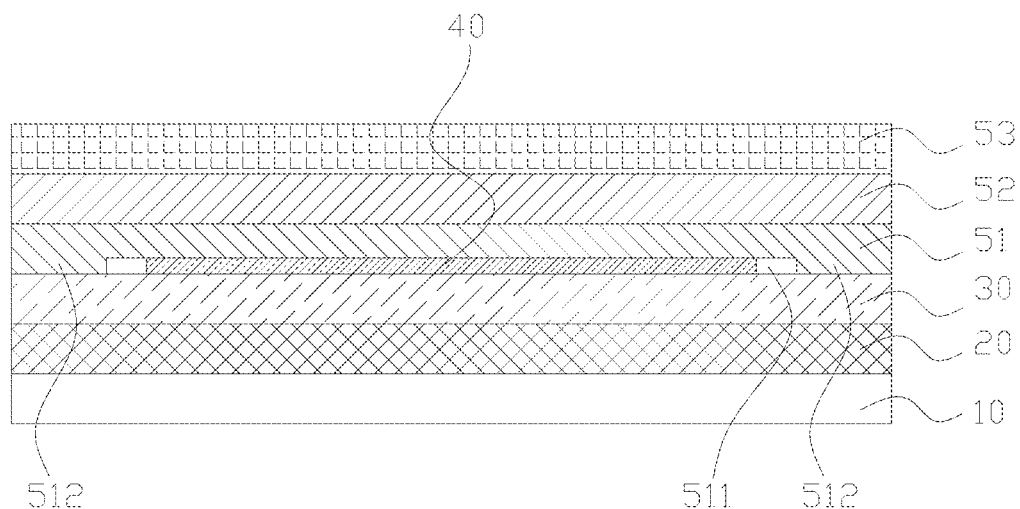
FIG. 4 is a schematic structural diagram of the package structure of another embodiment of FIG. 1.

In an implementation manner, referring to FIG. 4, the package structure further includes a second barrier layer 53. The second barrier layer 53 is stacked on the buffer layer 52 to further improve the water blocking capacity of the package.

In this embodiment, specifically, the material of the second barrier layer 53 may be the same as that of the first barrier layer 51, and both of them are inorganic materials and have a good function of blocking water and oxygen. Further, the concentration of the modified epoxy acrylate in the vicinity of the contact surface between the buffer layer 52 and the second barrier layer 53 of the present embodiment is increased so that the buffer layer 52 and the second barrier layer 53 also have a good adhesion effect and are hard to peel off.

Figure 5:
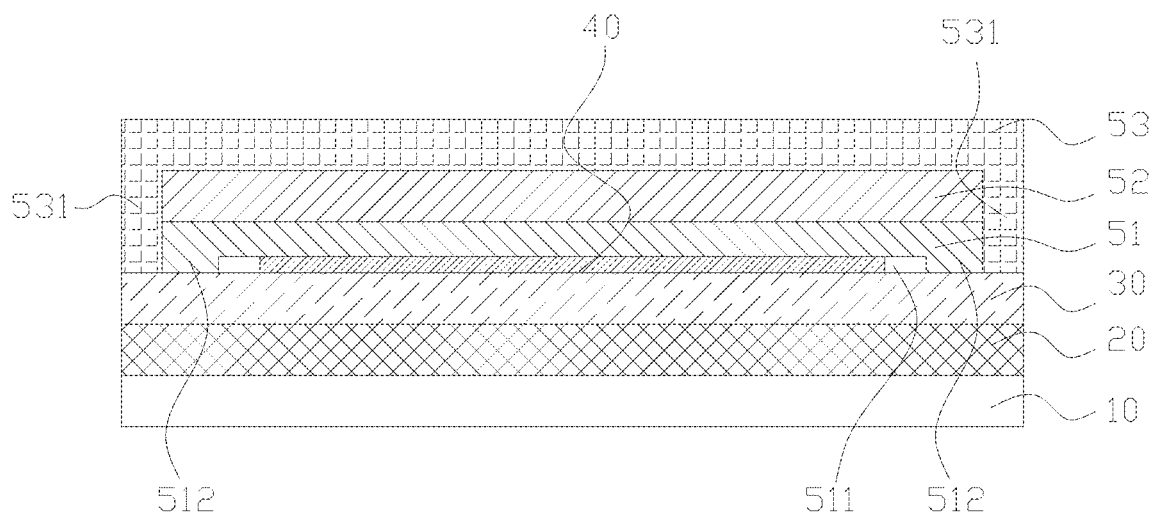
FIG. 5 is a schematic structural diagram of the package structure of another embodiment of FIG. 1.

In an implementation manner, referring to FIG. 5, the second barrier layer 53 surrounds the first barrier layer 51 and the buffer layer 52 so that the OLED layer 40 is surrounded by the first barrier layer 51 and the second barrier layer 53.

Specifically, the second barrier layer 53 includes a blocking end 531, the blocking end 531 includes two and is located at two opposite ends of the second blocking layer 53, the blocking ends 531 at both ends are adhered with the inorganic layer 30 so that the second barrier layer 53 and the inorganic layer 30 are enclosed to form a cavity structure. The OLED, the first barrier layer 52 and the buffer layer 52 are accommodated in the cavity. By disposing the blocking end 531 of the second blocking layer 53, the side surfaces of the OLED layer are protected by the first blocking layer 51 and the second blocking layer 53, thereby improving the water blocking oxygen capability of the package.

Figure 6:
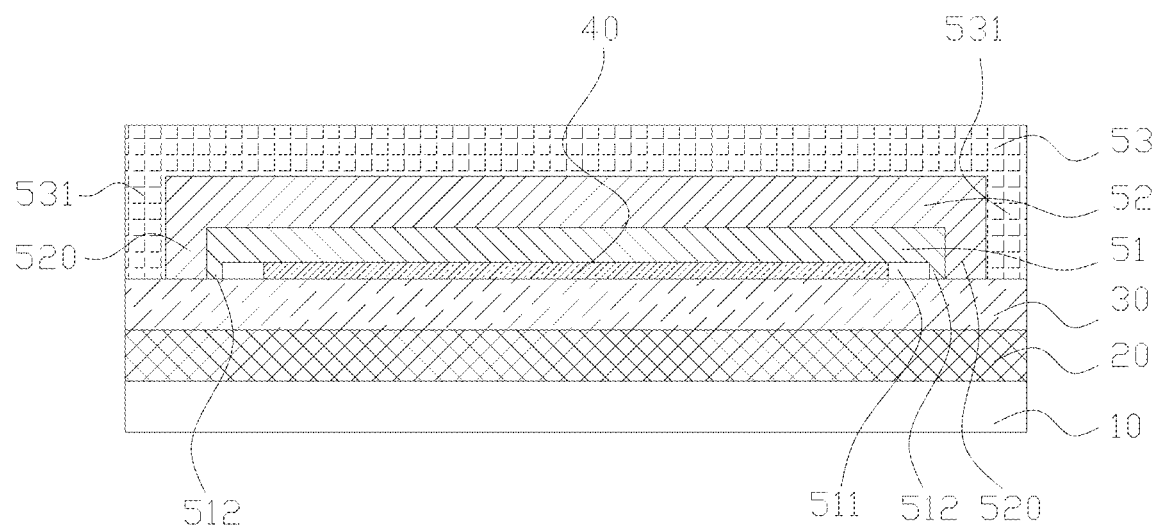
FIG. 6 is a schematic structural diagram of the package structure of another embodiment in FIG. 1.

In an implementation manner, referring to FIG. 6, the buffer layer 52 surrounds the first barrier layer 51, the second barrier layer 53 surrounds the buffer layer 52 such that the OLED layer is surrounded by the first barrier layer 51, the buffer layer 52 and the second barrier layer 53.

Specifically, the present embodiment is similar to the previous embodiment, except that the buffer layer 52 further includes a buffer end 520 provided at two opposite ends of the buffer layer 52, the buffer end 520 is adhered to the inorganic layer 30, the first barrier layer 51 and the closed end 512 are surrounded by the buffer layer 52 and the buffer end 520. The second barrier layer 53 and the barrier end 531 surround the buffer layer 52 and the buffer end 520. By disposing the buffer end 520 and the blocking end 531, the side surfaces of the OLED layer are protected by the first barrier layer 51, the buffer layer 52 and the second barrier layer 53, thereby improving the water blocking oxygen capability of the package.

Referring to FIG. 1, an embodiment of the present application further provides a packaging method, which includes the following steps:

providing a substrate 10, sequentially forming a base layer 20, an inorganic film layer 30, an OLED layer 40 and a first barrier layer 51 on the substrate;

forming a buffer layer 52 on the first barrier layer 51 by using the inkjet printing process, wherein the buffer layer 52 is doped with a modified epoxy acrylate;

irradiating the buffer layer 52 and the first barrier layer 51 with UV light so that the modified epoxy acrylate reacts with the first barrier layer 51 to adhere the buffer layer 52 and the first barrier layer 51.

In an implementation manner, referring to FIG. 1 to FIG. 3, the buffer layer 52 includes a first surface in contact with the first barrier layer 51 and a second surface opposite to the first surface. In fabricating the buffer layer 52, an ink-jet printing process is used multiple times to form a base layer 521/522/523/52N each time. The modified epoxy acrylate doped during inkjet printing is sequentially reduced so that the concentration of the modified epoxy acrylate in the buffer layer 52 is gradually decreased in a direction of the first surface toward the second surface.

An embodiment of the present application further provides an electronic device, which includes the package structure according to any one of the preceding embodiments.

The above disclosure is only one preferred implementation of the present application, and certainly can not be used to limit the scope of the present application. Those of ordinary skill in the art can understand that all or part of the processes for implementing the foregoing embodiments and equivalent changes made according to the claims of the present application still fall within the scope of the application.

What is claimed is:

1. A packaging method, comprising the following steps:

providing a substrate, sequentially forming a base layer, an inorganic film layer, an OLED layer and a first barrier layer on the substrate;

forming a buffer layer on the first barrier layer by using an inkjet printing process, wherein the buffer layer is doped with a modified epoxy acrylate;

irradiating the buffer layer and the first barrier layer with UV light so that the modified epoxy acrylate reacts with the first barrier layer to adhere the buffer layer to the first barrier layer;

wherein the buffer layer comprises a first surface in contact with the first barrier layer and a second surface opposite to the first surface, in fabricating the buffer layer, the ink jet printing process is used for a plurality of times so that a basic layer is formed each time, the modified epoxy acrylate doped during ink jet printing is sequentially reduced so that a concentration of the modified epoxy acrylate in the buffer layer gradually decreases in a direction of the first surface toward the second surface.

2. The packaging method according to claim 1, wherein the modified epoxy acrylate has a chemical formula of

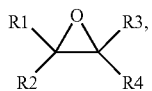

where at least one of the groups R1, R2, R3 or R4 has an alkoxy group.

3. The packaging method according to claim 2, wherein a surface of the first barrier layer further has a hydroxyl group, a chemical reaction equation of the hydroxyl group and the modified epoxy acrylate is:

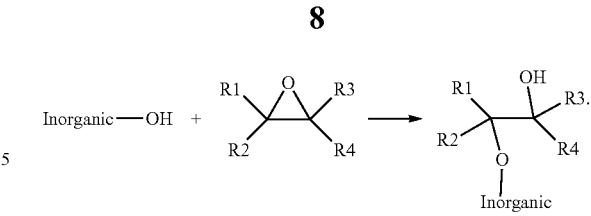

4. The packaging method according to claim 1, wherein the first barrier layer comprises a third surface in contact with the buffer layer and a fourth surface opposite to the third surface, a groove is provided in a middle of the fourth surface; the inorganic film layer and the first barrier layer are stacked, the fourth surface is in contact with the inorganic film layer, the groove and the inorganic film layer enclose to form a vacuum closed space, where the vacuum closed space is configured to encapsulate the OLED layer.

5. The packaging method according to claim 4, further comprising forming a second barrier layer on the buffer layer.

6. The packaging method according to claim 5, wherein the second barrier layer surrounds the first barrier layer and a lateral surface of the buffer layer so that the OLED layer is surrounded by the first barrier layer and the second barrier layer.

* * * * *